Nov. 9, 1965 W. STROHMEIER 3,217,173

PULSE GENERATOR EMPLOYING BIPOLAR-SIGNAL GATED BISTABLE AMPLIFIERS TO PRODUCE UNIPOLAR, SHAPED OUTPUT PULSES

Filed Nov. 13, 1961 2 Sheets-Sheet 1

INVENTOR:
Walter Strohmeier,
BY Henry L. Hanson
ATTORNEY

INVENTOR:
Walter Strohmeier,

BY Henry L. Hanson
ATTORNEY

United States Patent Office 3,217,173

Patented Nov. 9, 1965

3,217,173

PULSE GENERATOR EMPLOYING BIPOLAR-SIGNAL GATED BISTABLE AMPLIFIERS TO PRODUCE UNIPOLAR, SHAPED OUTPUT PULSES

Walter Strohmeier, Riehen, Basel-Stadt, Switzerland, assignor to Honeywell Inc., a corporation of Delaware Filed Nov. 13, 1961, Ser. No. 151,911

10 Claims. (Cl. 307—88.5)

This invention relates generally to electronic pulse processing circuits and more particularly to a new and improved electronic pulse processing circuit adapted to generate particularly shaped pulses of precisely controlled width for distribution to functions in a data processing system.

Those skilled in the art of electronic data processing, and in the various types of control circuits which are used therein, are familiar with the requirement in some types of data processing apparatus for a source of clock pulses of a particular shape and pulse width. Thus, it often is necessary to provide a source of clock pulses having a predetermined waveshape and having a rigidly controlled width to ensure proper operation of the data processing apparatus. The present invention, which is directed towards a new and highly advantageous solution to this problem, will be described hereinbelow for purposes of illustration with respect to a unique circuit for generating trapezoidal clock pulses having a pulse width determined by static rather than by dynamic or active components to thereby assure a rigidly controlled pulse width of the type required in highly accurate data processing systems.

In accordance with one illustrative embodiment of this invention, this desirable result is achieved in a novel circuit which comprises a buffer sine wave amplifier, a pulse forming stage, and one or more independent power channels fed by the output of the pulse forming stage. Master clock signals, such as sine waves, are applied to a transistorized buffer sine wave amplifier which serves as a low impedance driver for the pulse forming stage and to minimize the loading on the source of input master clock signals. In order to compensate for difference in delay between the master clock sine waves and the output pulses from the invention and also to take up slight variations in phase of the input sine wave, a variable capacitor may be provided across the input of the transformer coupling the buffer amplifier to the pulse forming stage.

The pulse forming stage essentially comprises a pair of gates transformer-coupled to the output of the buffer amplifier in a manner such that the gates are either opened or closed at the same time. Each gate is connected to a transistor switching circuit, and one of the transistor switching circuits has a static delay line connected to its output.

During one-half of the output sine wave from the buffer amplifier, the gates are closed, i.e., the gate circuit diodes are cut-off and since the gates, when open, function to maintain their transistor switches cut-off, the transistor switches are supplied with turn-on currents. In accordance with a salient feature of this invention, the output of each transistor switch is capacitatively coupled to the input of the other transistor switch to synchronize the switching times despite moderate differences or changes in gain which may be present between the two transistors.

The output of one transistor switch is applied directly to the input of an AND gate while the output of the other transistor switch is applied to the AND gate through a static delay line of fixed delay characteristics. This serves to generate at the output of the AND gate a clock pulse of desired waveform having a fixed predetermined pulse width suitable for effecting precision clocking functions in a data processing system. The advantage in generating the desired pulse in this unique way is to ensure that the pulse width will be determined by the static delay line rather than by active components—such as a dynamic flip-flop of the type used in the prior art—thereby assuring a precisely controlled pulse width. This pulse then may be applied to one or more power amplifier channels for distribution to various clock functions.

Thus, it is a general object of this invention to provide a new and improved electronic pulse processing circuit.

It is a more specific object of this invention to provide a new and improved electronic pulse processing circuit which is particularly adapted to generate pulses of a desired waveform and controlled pulse width as required in data processing apparatus.

It is another object of this invention to provide an electronic pulse processing circuit, as above, which is characterized by its use of static, rather than dynamic, delay elements in determining with precision the width of the pulses generated for use in controlling clock functions of data processing apparatus.

It is still another object of this invention to provide an electronic pulse processing circuit, as above, which comprises a pair of transistorized switching amplifiers adapted to be switched on by a master clock signal, and having capacitative cross-coupling therebetween to insure that both amplifiers will switch at the same time despite moderate differences or changes in gain which may be present between the two amplifiers.

It is a further object of this invention to provide an electronic pulse processing circuit, as above, which comprises a static delay line at the output of one of the switching amplifiers, the delayed pulse output of which is applied together with the direct output of the other switching amplifier to an AND gate to determine the width of a controlled pulse for distribution to clock functions in a data processing system.

It is a still further object of this invention to provide a new and improved electronic pulse processing circuit which is characterized by its accuracy, efficiency and reliability in generating clock pulses of controlled pulse width.

The novel features which are characteristic of the invention are set forth with particularity in the appended claims. The invention itself, however, both as to its organization and method of operation, together with further objects and advantages thereof, will best be understood by reference to the following description taken in conjunction with the accompanying drawings in which:

Figures 1, 2:
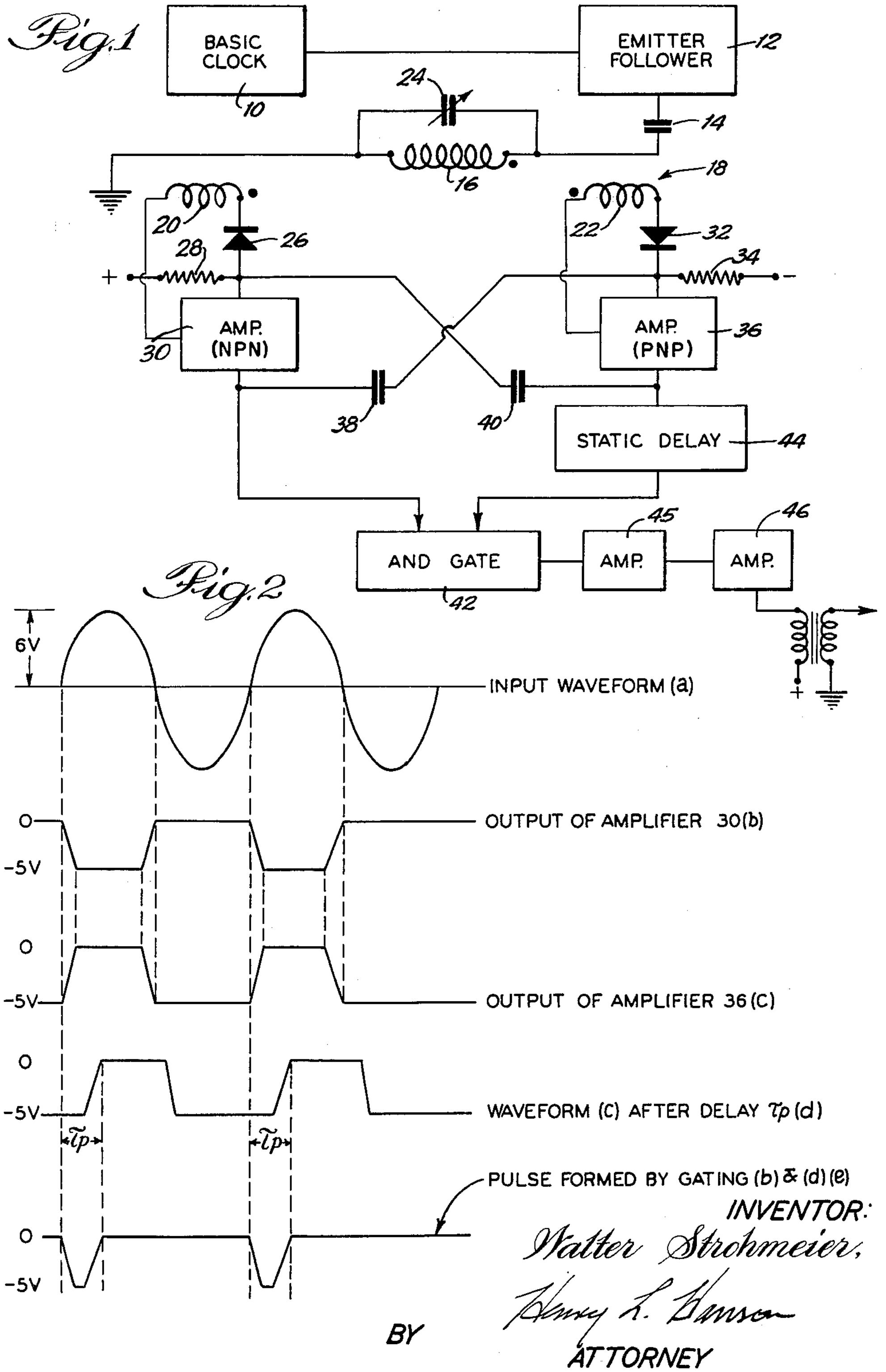
FIGURE 1 is a block diagram illustrative of one specific embodiment of the invention.
FIGURE 2 is a waveform diagram showing the pulse waveforms at different points in the circuit.

Referring now to the drawings, and more particularly to FIGURE 1, there is illustrated in block diagram form one illustrative embodiment of the signal processing circuit embodying the novel features of the present invention. As there shown, the invention comprises a source of reference or input signals, identified as the basic clock 10. While this illustrative embodiment discloses the input signals from basic clock 10 as being of sinusoidal waveform, those skilled in the art will readilly appreciate that the input signals are not limited to any specific form and may, if desired, be of other wave shapes. The input signals from basic clock 10 are applied to an emitter follower buffer amplifier 12 which advantageously functions to serve as a low impedance driver for the following pulse forming stages and also to minimize the loading on the input signal source.

The output of the emitter follower buffer amplifier 12 is coupled through a suitable capacitor 14 and the primary winding 16 of a coupling transformer 18 to the oppositely wound secondary windings 20 and 22 of transformer 18. In accordance with a feature of this invention, a variable capacitor 24 is connected in parallel with the primary winding 16 of transformer 18. The variable capacitor 24 is provided to compensate for any difference in delay between the reference or input signals from basic clock 10 and the output pulses from the invention circuit, and also to take-up slight variations in phase of the input signal from the basic clock 10. Thus, where the input signal from the basic clock 10 is in the form of a sinusoidal waveform signal, the variable capacitor 24 may be adjusted so that the sine wave appearing across the input transformer primary winding 16 is phase-shifted with respect to the input sine wave signal from the basic clock source.

Each of the secondary windings 20 and 22 of transformer 18 is connected to a separate pulse forming signal channel. Transformer secondary winding 20 is connected to the pulse forming channel comprised of a gate formed by the diode 26 and the resistance 28, which gate in turn is connected to a switching amplifier stage 30. The transformer secondary winding 22 is connected to a gate formed of the diode 32 and the resistance 34, which gate in turn is connected to the switching amplifier stage 36.

It will be noted that the transformer secondary windings 20 and 22 are provided in opposite polarity and that their associated diodes 26 and 32, respectively, are connected in opposite polarity with respect to each other. In the operation of the invention, the diodes 26 and 32 are normally conducting and their associated switching amplifier stages 30 and 36, respectively, are normally held in a non-conducting condition due to the conduction of the gate diodes. During the positive half of the input signal sine wave at the transformer primary winding 16, the diodes 26 and 32 are cut-off and consequently the switching amplifier stages 30 and 36 are supplied with turn-on currents.

The switching of the amplifier stages 30 and 36 from a non-conducting to a conducting condition is facilitated, in accordance with a feature of this invention, by the provision of the coupling capacitors 38 and 40 which couple the output of each switching amplifier stage to the input of the other switching amplifier stage. This capacitative cross-coupling between the switching amplifier stages ensures that the switching amplifiers will switch in the same time despite any moderate differences or changes in gain which may exist therebetween due to differences in the components or as a result of aging or the like.

The output of switching amplifier stage 30 is connected directly to one input of an AND gate 42, while the output of switching amplifier stage 36 is connected through a fixed static delay means 44 to the other input of the AND gate 42. The operation of the circuit is illustrated by the waveform chart of FIGURE 2 of the drawing. The input waveform shown in FIGURE 2(*a*) is a sinusoidal input signal which is supplied from the basic clock 10. The trapezoidal shaped pulses of FIGURE 2(*b*) illustrates the output of switching amplifier 30, while the opposite polarity trapezoidal shaped pulses shown in FIGURE 2(*c*) illustrates the output from the switching amplifier 36. The output from switching amplifier 36, as shown in FIGURE 2(*c*), is delayed by a fixed predetermined amount by the static delay 44, and this delayed output is illustrated in FIGURE 2(*d*). The combination of the signals from the switching amplifier 30 and the static delay 44, as illustrated in FIGURES 2(*b*) and 2(*d*), generate the desired output signal pulse at the output of the AND gate 42. These trapezoidal shaped output signal pulses are of controlled width and are illustrated in FIGURE 2(*e*) of the drawing. It will be appreciated by those skilled in the art, as brought out in still greater detail hereinbelow, that the generation of the signal pulses of FIGURE 2(*e*) in accordance with the present invention ensures that the pulse width is determined by the static delay 44 rather than by active components, such as the dynamic flip-flop circuits used in the prior art. This assures the reliability and reproduceability of the signal pulses which is highly important in controlling the clock functions of many data processing systems.

The trapezoidal-shaped output signal pulses from the AND gate 42 then can be applied to one or more power amplifier channels, such as the power amplifier channel comprising amplifiers 45 and 46, for distribution to various clock functions in the data processing system or to any other load or utilization device.

A detailed schematic circuit diagram of the invention is shown in FIGURE 3 of the drawing. FIGURE 3 is depicted as comprising FIGURE 3(*a*) which includes the buffer amplifier stage, the adjustable capacitance and coupling transformer, the two pulse forming stages including their associated gates and switching amplifiers, and the static delay at the output of one of the switching amplifiers. FIGURE 3(*b*) discloses a pair of independent power amplifier channels, each including an AND gate for receiving the output of the pulse forming stages and their associated power amplifier stages for distributing the shaped pulses to the desired circuit functions.

As shown in FIGURE 3(*a*), the invention comprises a transistorized local sine wave or buffer amplifier which includes the transistor 12 having its base connected through the resistance 52 to a source of clock input pulses. The clock input signals are applied from the input line 54 through a capacitor 56 which is connected in series with an inductance 58 to the junction of the resistors 60 and 62 which form a voltage divider network between a source of negative voltage and ground. As shown, the resistance 52 is connected to the junction of capacitor 56 and inductance 58. Transistor 12 is connected as an emitter follower with its collector connected to ground and its emitter connected through the resistor 64 to a suitable source of negative voltage. The output of transistor 12 is taken from the emitter by the capacitor 14 which is connected in series with the resistance 70 and primary winding 16 of the coupling transformer 18.

It has been found advantageous in one specific embodiment of the invention to utilize a single, high speed NPN Mesa transistor in the buffer amplifier 12 which is connected in a class A emitter-follower configuration. As explained hereinabove, the buffer amplifier stage 12 serves as a low impedance driver for the following pulse forming stages and also to minimize the loading on the input source.

The coupling transformer 18 comprises a pair of secondary windings 20 and 22 which are connected in opposite polarity with respect to each other so as to provide signals of opposite phase to their respective pulse forming stages upon receipt of an input signal from the emitter-follower buffer amplifier. Secondary winding 20 is connected through a gate comprised of the diode 26 and resistor 28 to a pair of diodes 68 and 72 which are connected respectively to the base and collector of the switching amplifier transistor 30′. The base of the transistor 30′ also is connected through resistor 74 to a suitable negative voltage source while the collector of transistor 30′ also is connected through the resistor 76 to a suitable source of positive voltage. The emitter of transistor 30′ is returned to the remaining terminal of the transformer secondary winding 20 and through the resistor 78 to a suitable source of negative voltage. In addition, the emitter of transistor 30′ is connected to the junction of a capacitor 80 which is returned to ground and to a diode 82 which is returned to a source of negative voltage. The output of transistor 30′ at its collector is connected to an output line 86 and also to a diode 88 and to the coupling capacitor 38 which couples the output of the transistor 30' to the input of transistor 36'.

Input signals are supplied from the transformer 18 to the input of transistor 36' by means of the gate formed by the diode 32 and resistor 34, the junction of which is connected through diode 90 to the base of transistor 36'. A resistor 92 is connected to the junction of diode 90 and the base of transistor 36'.

The emitter of transistor 36' is connected to ground and the output of transistor 36' at its collector is coupled through the coupling capacitor 40 to the input of the transistor 30'. Thus, as explained hereinabove, it can be seen that the two transistor switching amplifiers are capacitatively cross-coupled between their respective outputs and inputs to ensure that the switching amplifiers will be switched at the same time upon receipt of an input pulse despite any moderate differences or changes in gain which may exist between the transistor amplifiers, either initially or as a result of aging.

The output of the switching amplifier transistor 36' is applied to a static delay element 44, which advantageously may take the form of an inductance delay line connected in series between the collector of transistor 36' and the resistor 94. In addition, the resistor 96 and the diode 98 are connected from the collector of transistor 36 to suitable sources of negative voltage. In the positive half of the input sine wave to the cross-coupled switching amplifiers, the gate diodes 26 and 32 are cut-off, and consequently, the transistors 30' and 36' will be supplied with turn-on currents. As stated above, capacitative cross-coupling between these two transistors causes them to switch in the same time. Transistor 30' advantageously is used in a non-saturating, high speed circuit, with its off level clamped to ground. Its emitter is referenced to a suitable negative voltage, as by means of the voltage dropping silicon diode 82 in order to ensure that the collector will be maintained at a sufficiently negative voltage for proper gating in the next stage connected to the output line 86.

Due to the operation of the static delay 44 in the collector circuit of transistor 36', the output waveform of transistor 36' is delayed a desired amount. A tap connection 100 is provided on the delay line 44 for enabling the pulse width to be varied to a desired width by selecting the amount of delay at the output of the transistor 36'. In one illustrative embodiment of this invention, the collector waveform of transistor 36' was delayed by about ninety milli-microseconds ($90 \cdot 10^{-9}$ sec.) to achieve the waveforms shown in FIGURE 2(*d*).

Figure 3A:
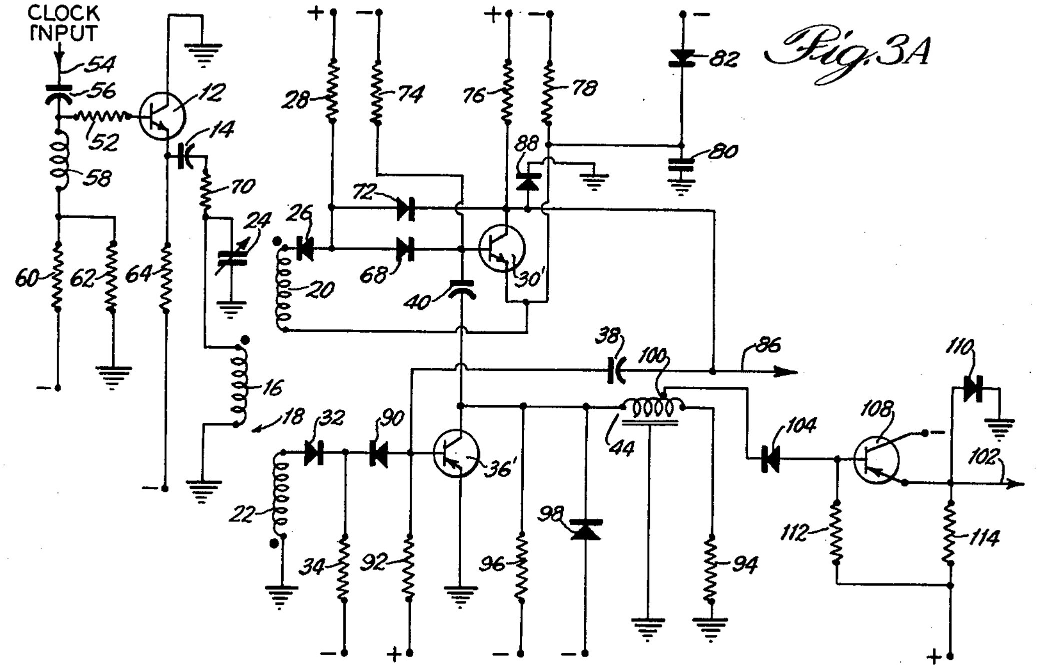
FIGURE 3 is a schematic circuit diagram showing in detail one particular embodiment of the invention.

The output from the delay line tap 100 advantageously may be applied to an emitter-follower stage to isolate the nonlinear gate load connected to the output line 102 from the delay line 44. As shown in FIGURE 3A, this emitter-follower stage comprises a diode 104 connected in series to the base of transistor 108. The collector of transistor 108 is connected to a source of negative voltage and the emitter is connected to the ouput line 102 and through the diode 110 to ground. In addition, the base of transistor 108 is connected through resistor 112 to a suitable source of positive voltage, and in the same manner, the emitter of transistor 108 is connected through the resistor 114 to the source of positive voltage. The emitter-follower stage comprising the transistor 108 enables the delay line 44 to be correctly terminated at all times, with consequent freedom from reflections and poor waveforms. Those skilled in the art will appreciate that delay through transistor 108 is negligible.

Figure 3B:
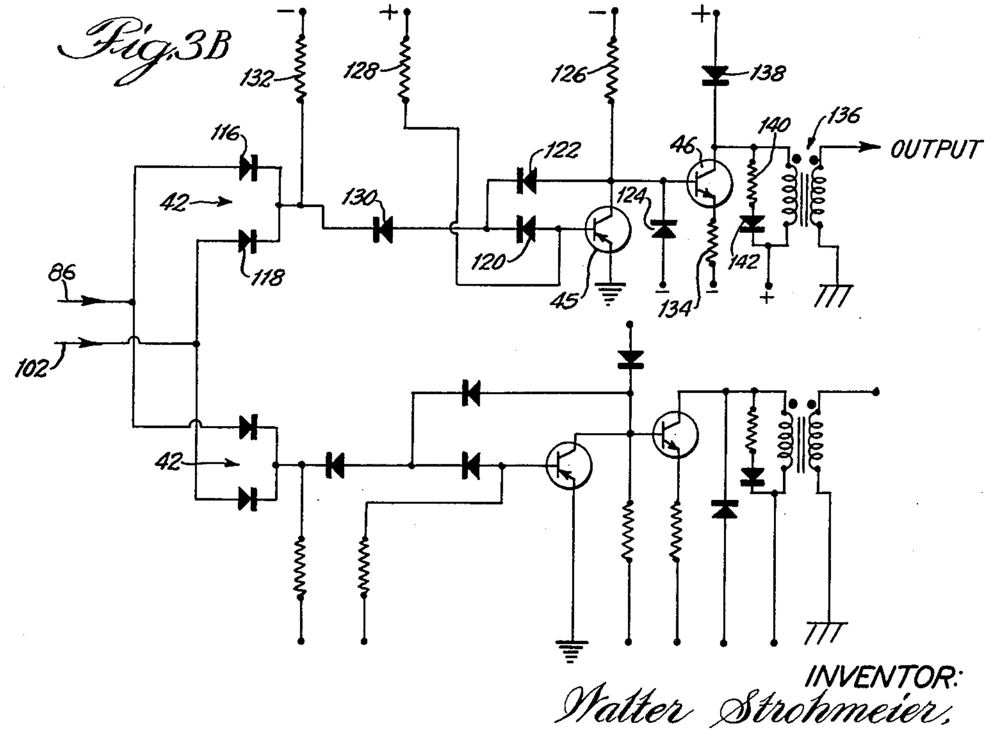

The waveform on the output line 86, as illustrated by FIGURE 2(*b*), and the waveform on the output line 102, as illustrated by FIGURE 2(*d*), are applied to one or more AND gates 42, of which two are illustrated in FIGURE 3B. Since the various AND gates and their associated power amplifier channels are substantially identical, only the construction and operation of one AND gate and its power amplifier channel will be described herein. However, those skilled in the art will appreciate that as many AND gates and power amplifier channels may be coupled to the output of the switching amplifier stages, as desired, dependent upon the number of clock functions to be controlled by the invention.

The AND gate 42 comprises the diodes 116 and 118 connected so as to provide an output pulse of trapezoidal waveform and of pulse width determined by the static delay line 44. This pulse formed by the AND gate 42 is shown in FIGURE 2(*e*) of the drawing. The output of the AND gate 42 is applied to the junction of diode 130 and resistor 132 and through diode 130 to a two-stage power amplifier having a transformer coupled output stage. The first stage of the power amplifier advantageously comprises a high speed, low power transistor 45, such as a PNP transistor operating "out of saturation." Silicon diode 120 is connected to the transistor base to introduce a noise rejection level of suitable amplitude on the emitter-follower output, and in conjunction with diode 122 maintains transistor 45 out of saturation in the conduction phase. The "off" level collector voltage is clamped by means of the diode 124 and the resistor 126 to a suitable negative voltage. The emitter of transistor 45 is connected to ground and the base is connected through the resistor 128 to a suitable positive voltage source.

The second amplifier stage, which advantageously may comprise a NPN transistor 46, is coupled directly to the output of transistor 45. Advantageously, transistor 46 may be a high speed, Mesa power transistor which functions as a non-saturating transformer coupled output stage.

In the operation of the invention, a constant current in injected into the emitter of transistor 46 through resistance 134. This current is set so as to ensure the right voltage swing on the primary winding of the output transformer 136 under maximum load conditions. The transistor 46 is prevented from entering saturation by clamping the forward excursion of its collector to a suitable voltage through the clamping diode 138 to thereby maintain a substantial voltage across the transistor and to contribute to fast response time.

When the pulse reaches a certain negative level, the driven load is thrown off. Means may be provided to ensure that this sudden load reduction does not result in transistor 46 entering saturation. This condition may be met by setting sufficient collector current so that under maximum load conditions transistor 46 just enters the forward clamping condition. Then, with reduced load, the excess collector current will "spill" into the clamping diode 138, and only the proper amount of current, as determined by the external load, will flow into the primary winding of the transformer 136. Advantageously, a resistor 140 and a diode 142 is connected in series across the primary winding of transformer 136 to maintain the desired waveform.

While there has been shown and described a specific embodiment of the present invention, it will, of course, be understood that various modifications and alternative constructions may be made without departing from the true spirit and scope of the invention. Therefore, it is intended by the appended claims to cover all such modifications and alternative constructions as fall within their true spirit and scope.

What is claimed as the invention is:

1. The improvement of a signal processing circuit for generating a unipolar signal pulse of controlled pulse width comprising a source of bipolar input signals, a pair of pulse forming signal channels coupled to said source of input signals, each of said signal channels comprising a gate circuit in series with a switching amplifier stage, said switching amplifier stage normally being held in a non-conducting condition by the open condition of its associated gate circuit, each of said gate circuits being closed upon receipt of a signal of a given polarity from said source to switch the switching amplifiers to a conducting condition to provide a shaped signal pulse in each signal channel at the output of each amplifier, static delay means having a fixed predetermined delay connected to the output of one of said signal channel amplifier stages, and output gate means arranged to be responsive to the simultaneous presence of output signals of the same polarity in both signal channels for providing a unipolar signal pulse of controlled pulse width, said controlled pulse width being determined by the delay period of said static delay means.

2. The improvement of a signal processing circuit for generating a unipolar signal pulse of controlled pulse width comprising a source of bipolar input signals, selectively adjustable phase shift means connected to said source for providing signals having a desired phase relationship to the signals received from said source, a pair of pulse forming signal channels coupled to the output of said phase shift means for receiving signals of opposite polarity therefrom, each of said signal channels comprising a normally open gate circuit in series with a normally non-conducting switching amplifier stage, each of said gate circuits being closed upon receipt of a signal of a given polarity from said phase shift means to switch its switching amplifier stage to a conducting condition for a time period sufficient to provide a shaped signal pulse in each signal channel at the output of each amplifier, capacitor means connected between the input of each switching amplifier stage and the output of the other switching amplifier stage to enable both switching amplifier stages to switch at the same time despite any differences in gain which may exist therebetween, static delay means having a fixed predetermined delay connected to the output of one of said signal channel amplifier stages, and output gate means coupled to said static delay means and to the other one of said amplifier stages, said output gate means being responsive to the presence of output signals in both signal channels for providing a unipolar signal pulse of controlled pulse width, said controlled pulse width being determined by the delay period of said static delay means.

3. The improvement of a signal processing circuit for generating a unipolar signal pulse of controlled pulse width comprising a source of bipolar input signals, selectively adjustable phase shift means connected to said source for providing signals having a desired phase relationship to the input signals received from said source, a pair of pulse forming signal channels coupled to the output of said phase shift means, each of said signal channels comprising a normally open gate circuit in series with a normally non-conducting switching amplifier stage, each of said gate circuits being closed upon receipt of a signal of a given polarity from said phase shift means to switch its switching amplifier stage to a conducting condition for a time period sufficient to provide a shaped signal pulse in each signal channel, static delay means having a fixed predetermined delay connected to the output of one of said signal channel ampliler stages, and output gate means coupled to said static delay means and to the other one of said amplifier stages, said output gate means being responsive to the simultaneous presence of output signals of the same polarity in both signal channels for providing a unipolar signal pulse of controlled pulse width, said controlled pulse width being determined by the delay period of said static delay means.

4. The improvement of a signal processing circuit for generating a unipolar signal pulse of controlled pulse width comprising a source of sinusoidal waveform signals, selectively adjustable phase shift means connected to said source for providing bipolar input signals having a desired phase relationship to the signals received from said source, a pair of pulse forming signal channels coupled to the output of said phase shift means for receiving signals of opposite polarity therefrom, each of said signal channels comprising a gate circuit in series with a switching amplifier stage, each said switching amplifier stage normally being held in a non-conducting condition by the open condition of its associated gate circuit, each of said gate circuits being closed upon receipt of a signal of a given polarity from said phase shift means to switch the switching amplifiers to a conducting condition for a time period sufficient to provide a shaped signal pulse in each signal channel at the output of each amplifier stage, static delay means having a fixed predetermined delay connected to the output of one of said signal channel amplifier stages, and output gate means coupled to said static delay means and to the other one of said amplifier stages, said output gate means being responsive to the presence of output signals in both signal channels for providing a unipolar signal pulse of controlled pulse width, said controlled pulse width being determined by the delay period of said static delay means.

5. The improvement of a signal processing circuit for generating a unipolar signal pulse of controlled pulse width comprising a source of bipolar input signals, a pair of pulse forming signal channels coupled to said source of input signals, each of said signal channels comprising a gate circuit in series with a switching amplifier stage, said switching amplifier stage normally being held in non-conducting condition by the open condition of its associated gate circuit, each of said gate circuits being closed upon receipt of a signal of a given polarity from said source to switch the switching amplifiers to a conducting condition to provide a shaped signal pulse in each signal channel at the output of each amplifier, capacitor means connected between the input of each switching amplifier stage and the output of the other switching amplifier stage to ensure that both switching amplifier stages are switched at the same time despite any differences in gain which may exist therebetween, static delay means having a fixed predetermined delay connected to the output of one of said signal channel amplifier stages, and output gate means arranged to be responsive to the simultaneous presence of output signals of the same polarity in both signal channels for providing a unipolar signal pulse of controlled pulse width, said controlled pulse width being determined by the delay period of said static delay means.

6. The improvement of a signal processing circuit for generating a unipolar signal pulse of controlled pulse width comprising a source for providing a pair of input signals of opposite polarity, a pair of pulse forming signal channels coupled to the output of said source for receiving said signals of opposite polarity, each of said signal channels comprising a gate circuit in series with a switching amplifier stage, each of said gate circuits upon receipt of an input signal serving to switch the switching amplifiers from one conducting condition to another to provide a shaped signal pulse in each signal channel, static delay means having a fixed predetermined delay connected to the output of one of said signal channel amplifier stages, and output gate means arranged to be responsive to the simultaneous presence of output signals of the same polarity in both signal channels for providing a unipolar signal pulse of controlled pulse width, said controlled pulse width being determined by the delay period of said static delay means.

7. The improvement of a signal processing circuit for generating a unipolar signal pulse of controlled pulse width comprising a source for providing a pair of input signals of opposite polarity, a pair of pulse forming signal channels coupled to the output of said source for receiving said signals of opposite polarity, each of said signal channels comprising a gate circuit in series with a switching amplifier stage, each of said gate circuits upon receipt of an input signal serving to switch the switching amplifiers from one conducting condition to another to provide a shaped signal pulse in each signal channel at the output of each amplifier stage, capacitative means cross-coupling the outputs and inputs of said switching amplifier stages to ensure simultaneous conduction of said amplifier stages, static delay means having a fixed predetermined delay connected to the output of one of said signal channel amplifier stages, and output gate means arranged to be responsive to the simultaneous presence of output signals of the same polarity in both signal channels for providing a unipolar signal pulse of controlled pulse width, said controlled pulse width being determined by the delay period of said static delay means.

8. The improvement of a signal processing circuit for generating a unipolar signal pulse of controlled pulse width comprising a source for providing a pair of bipolar sinusoidal waveform signals of opposite phase, a pair of pulse forming signal channels coupled to said source for receiving said signals of opposite phase, each of said signal channels comprising a normally non-conductive switching amplifier stage, and switching means coupled between said source of sinusoidal signals and said switching amplifier stage, said switching means being operative upon receipt of a signal of a given polarity from said source to switch the switching amplifiers to a conducting condition for a time period sufficient to provide a shaped signal pulse in each signal channel at the output of each amplifier stage, static delay means having a fixed predetermined delay connected to the output of one of said signal channel amplifier stages, and output gate means arranged to be responsive to the simultaneous presence of output signals of the same polarity in both signal channels for providing a unipolar signal pulse of controlled pulse width, said controlled pulse width being determined by the delay period of said static delay means.

9. The improvement of a signal processing circuit for generating a unipolar signal pulse of controlled pulse width comprising a source for providing a pair of bipolar sinusoidal waveform signals of opposite phase, a pair of pulse forming bipolar signal channels coupled to said source for receiving said signals of opposite phase, each of said signal channels comprising a normally non-conductive switching amplifier stage, and switching means coupled between said source of sinusoidal signals and said switching amplifier stage, said switching means being operative upon receipt of a signal of a given polarity from said source to switch the switching amplifiers to a conducting condition for a time period sufficient to provide a shaped signal pulse in each signal channel at the output of each amplifier stage, capacitative means cross-coupling the output of each amplifier stage to the input of the other amplifier stage to cause said amplifier stages to switch at the same time despite moderate differences in gain which may exist therebetween, static delay means having a fixed predetermined delay connected to the output of one of said signal channel amplifier stages, and output gate means arranged to be responsive to the simultaneous presence of output signals of the same polarity in both signal channels for providing a unipolar signal pulse of controlled pulse width, said controlled pulse width being determined by the delay period of said static delay means.

10. The improvement of a signal processing circuit for generating a unipolar clock signal pulse of controlled pulse width and shape comprising a source for providing a pair of bipolar sinusoidal waveform signals of opposite phase, a pair of input coupling inductances connected at the output of said source and arranged to present input signals of opposite polarity, a pair of pulse forming signal channels each being connected to a different one of said inductances for receiving signals of opposite polarity therefrom, being thereby coupled to the output of said source for receiving said signals of opposite phase, each of said signal channels comprising a normally-open diode gate circuit connected in series with a pulse-generating transistor, the normally-open condition of said gate being operative to hold said transistor non-conductive, both of said gate circuits being simultaneously closed upon receipt of signals respectively of opposite polarities from said inductances to switch its associated pulse generating transistor to a conducting condition for a time period sufficient to provide a shaped signal pulse in each signal channel at the output thereof, said transistors being of opposite conductivity and having substantially identical turn-on characteristics, capacitative means coupling the input of each stage to the output of the other stage to enable both stages to switch to said conducting condition at the same time despite any differences in gain which may exist therebetween, a static inductive delay means having a fixed predetermined adjustable delay connected to the output of one of said transistors, and ANDing means coupled to said delay means and to the other one of said transistors, said ANDing means being adapted to respond to the presence of output signals from both signal channels to combine them and thereby provide clock pulses of controlled pulse width, and symmetrical shape, said pulses being initiated and terminated, respectively, by the leading portions of said signal channel pulses, said controlled pulse width being determined by the delay period of said static delay means.

References Cited by the Examiner

UNITED STATES PATENTS

| | | | |
|---|---|---|---|
| 2,445,785 | 7/48 | Levy | 328—61 X |
| 2,977,485 | 3/61 | Olsen. | |
| 3,028,552 | 4/62 | Hahs | 328—55 |
| 3,036,272 | 5/62 | Vezu | 328—56 X |

ARTHUR GAUSS, *Primary Examiner.*

GEORGE N. WESTBY, *Examiner.*